(12) United States Patent
Brown et al.

(10) Patent No.: US 8,123,559 B2
(45) Date of Patent: Feb. 28, 2012

(54) STACKED PLUGGABLE CAGE HAVING INTERMEDIATE WALLS INTERENGAGED EACH OTHER

(75) Inventors: Robert W. Brown, Harrisburg, PA (US); Gary E. Biddle, Carlisle, PA (US)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 342 days.

(21) Appl. No.: 12/384,198

(22) Filed: Apr. 1, 2009

(65) Prior Publication Data

US 2010/0254112 A1    Oct. 7, 2010

(51) Int. Cl.
H05K 7/20    (2006.01)

(52) U.S. Cl. .............. 439/607.21; 439/607.23; 361/816; 361/818

(58) Field of Classification Search ............. 439/607.08, 439/607.09, 607.17
See application file for complete search history.

(56) References Cited

U.S. PATENT DOCUMENTS

| | | | |
|---|---|---|---|
| 3,587,028 A * | 6/1971 | Uberbacher | 439/49 |
| 6,193,554 B1 * | 2/2001 | Wu | 439/607.25 |
| 6,382,987 B1 * | 5/2002 | Yu | 439/79 |
| 6,558,191 B2 * | 5/2003 | Bright et al. | 439/541.5 |
| 6,604,964 B2 * | 8/2003 | Hoshino et al. | 439/607.55 |
| 6,731,519 B1 | 5/2004 | Hwang | |
| 6,752,663 B2 * | 6/2004 | Bright et al. | 439/607.25 |
| 6,972,968 B2 | 12/2005 | Hwang | |
| 7,001,217 B2 | 2/2006 | Bright et al. | |
| 7,357,673 B2 | 4/2008 | Long | |
| 7,575,471 B2 * | 8/2009 | Long | 439/541.5 |
| 7,641,515 B1 * | 1/2010 | Szczesny et al. | 439/607.01 |
| 7,845,975 B2 * | 12/2010 | Cheng et al. | 439/541.5 |
| 7,901,221 B1 * | 3/2011 | Li et al. | 439/95 |
| 2009/0098767 A1 * | 4/2009 | Long | 439/541.5 |

* cited by examiner

*Primary Examiner* — Jinhee Lee
*Assistant Examiner* — Anthony Q Edwards
(74) *Attorney, Agent, or Firm* — Wei Te Chung; Andrew C. Cheng; Ming Chieh Chang

(57) ABSTRACT

A stacked pluggable cage (100) in accordance with the present invention is adapted for receiving two transceivers (200). The stacked pluggable cage includes a shielding shroud (11) defining a receiving space (13), and a first and a second intermediate walls (12) inserted in the shielding shroud. The first and second intermediate walls are disposed adjacent to each other to divide the receiving space into a first and a second receiving subspaces (13a, 13b) for receiving the transceivers respectively. Each intermediate wall has a body portion (121), and a number of flexible fingers (124) extending rearwardly from the body portion and tilting toward corresponding receiving subspace for grounding corresponding transceiver to thereby improve EMI performance.

16 Claims, 10 Drawing Sheets

STACKED PLUGGABLE CAGE HAVING INTERMEDIATE WALLS INTERENGAGED EACH OTHER

BACKGROUND OF THE INVENTION

1. Field of the Invention

The present invention relates to a pluggable cage, and more particularly to a stacked pluggable cage having intermediate walls interlocked with each other.

2. Description of Related Art

A standard in development for a next generation of SFP (Small Form-Factor Pluggable transceiver) module, presently being called the XFP (10 Gigabit Small Form-Factor Pluggable transceiver) standard, calls for the transceiver modules to carry data signals at rates up to 10 Gbps.

U.S. Pat. No. 6,972,968 issued to Hwang on Jun. 22, 2004 and U.S. Pat. No. 6,731,519 issued to Hwang on May 4, 2004 discloses an SFP cage. The SFP cage comprises stacked upper and lower ports and a spacer sandwiched between the upper and lower ports. Each port has a top wall, a pair of side walls and a bottom wall connected together to surround the port.

A spacer is provided between bottom wall of the upper port and a top wall of the lower port would result in material wasted. Additionally, it is hard to achieve improved EMI (Electro Magnetic Interference) shielding since the spacer would not electrically engage the transceiver.

U.S. Pat. No. 6,752,663 issued on Jun. 22, 2004 discloses a pluggable cage having one port comprises a receptacle for receiving a transceiver. The receptacle has an upper wall, a bottom wall defining a bottom opening, a pair of side walls, a wall and a receiving cavity defined therebetween. A shielding member including a plurality of fingers is mounted to a rear edge of the bottom wall, with the plurality of fingers projecting inwardly for touching with the inserted transceiver to improve EMI performance.

When the pluggable cage has more than two stacked ports and is adapted for receiving corresponding number of transceivers, the shielding member mounted on the bottom wall could not provide EMI shielding performance to the transceiver away from the bottom wall.

Hence, a stacked pluggable cage having an improved intermediate wall is highly desired.

SUMMARY OF THE INVENTION

Accordingly, an object of the present invention is to provide a stacked pluggable cage having a pair of improved intermediate walls interlocked together for achieving an improved EMI performance to the transceivers.

In order to achieve the object set forth, a stacked pluggable cage in accordance with the present invention is adapted for receiving at least two transceivers. The stacked pluggable cage comprises a shielding shroud having a plurality of walls interconnected together to define a receiving space therebetween, and at least a first and a second intermediate walls inserted in the shielding shroud. The first and second intermediate walls are disposed adjacent to each other to divide the receiving space into a first receiving subspace above the first intermediate wall and a second receiving subspace below the second intermediate wall for receiving the transceivers respectively. Each intermediate wall has a body portion, a bending portion bent from a front portion of the body portion, and a plurality of flexible fingers extending rearwardly from a rear portion of the body portion and tilting toward corresponding receiving subspace to ground corresponding transceiver.

The intermediate walls inserted in each receiving subspaces would have the flexible fingers in contact with each transceiver to thereby ground each transceiver. Therefore, the EMI shielding performance of the transceivers has been improved.

Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to the preferred embodiment of the present invention.

Figure 1:
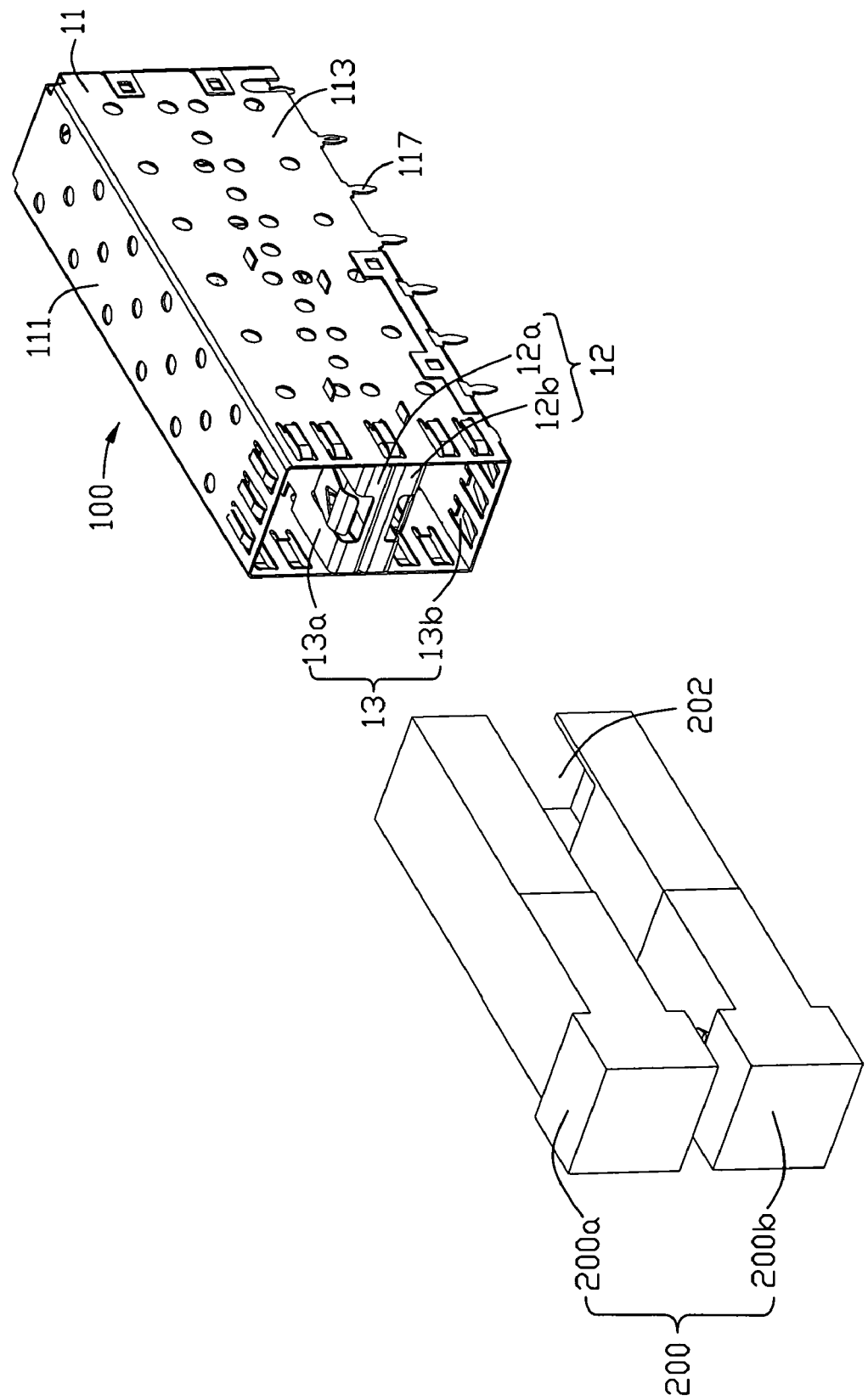
FIG. 1 is a perspective view showing an assembled stacked pluggable cage in accordance with the present invention and two transceivers.
Figure 2:
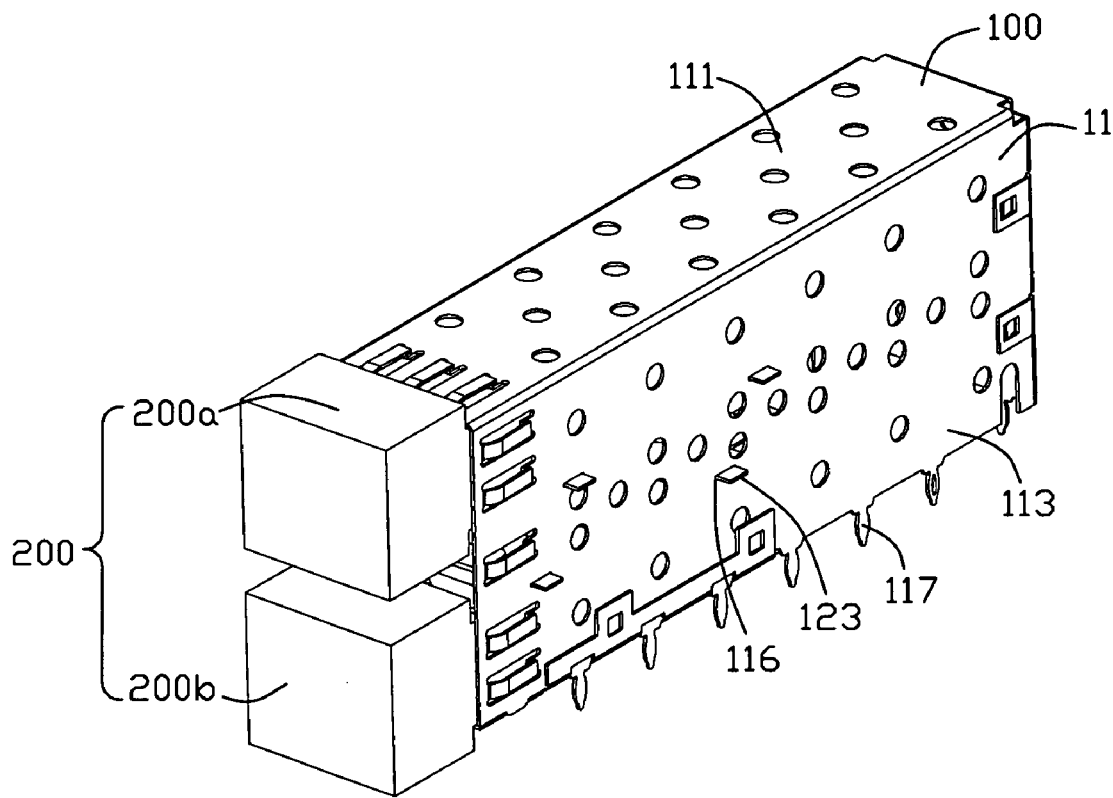
FIG. 2 is an assembled perspective view showing the stacked pluggable cage and the transceivers received in the stacked pluggable cage.

Referring to FIGS. 1-2, a stacked pluggable cage assembly 100 adapted for receiving two transceiver 200, i.e. upper and lower transceivers 200a, 200b in accordance with the present invention comprises a shielding shroud 11 and a pair of intermediate walls 12. In conjunction with FIGS. 6-7, each transceiver 200 has a locking protrusion 201 formed toward corresponding intermediate wall 12 and a cavity 202 defined at a rear portion thereof and opened toward corresponding intermediate wall 12.

Figure 3:
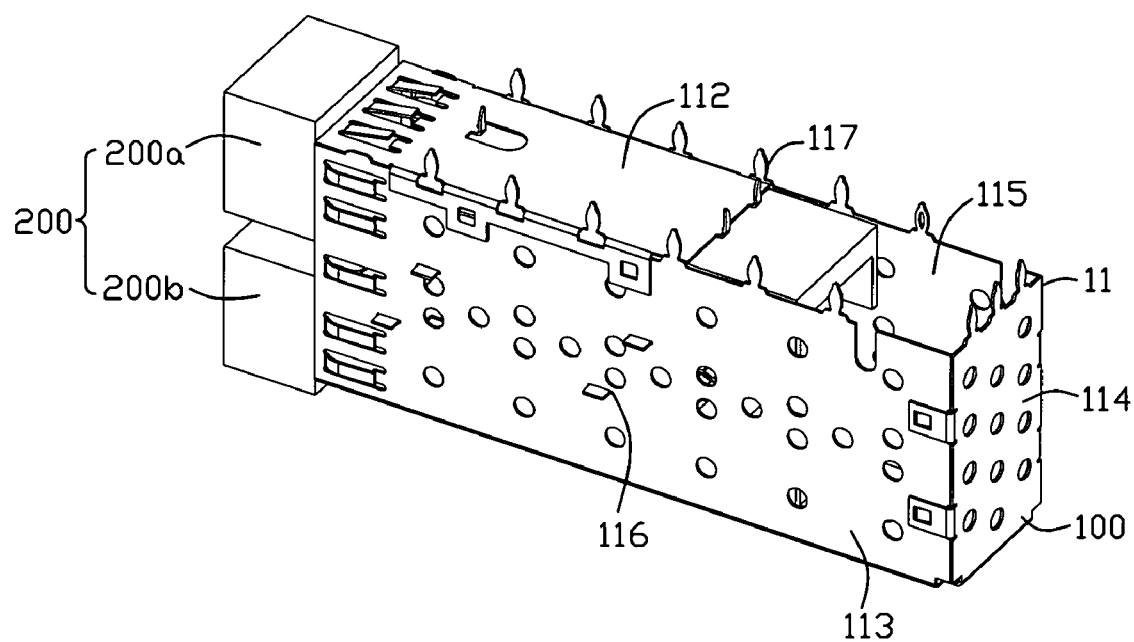
FIG. 3 is a view similar to FIG. 2, taken from another aspect.

Referring to FIGS. 1-3, the shielding shroud 11 comprises a top wall 111, a bottom wall 112 defining a bottom opening 115, a pair of side walls 113 and a rear wall 114 interconnected together to define a receiving space 13 therebetween. The side walls 113 have a plurality of engaging slits 116 defined thereon and a plurality of foot portions 117 extending downwardly therefrom.

Figure 4:
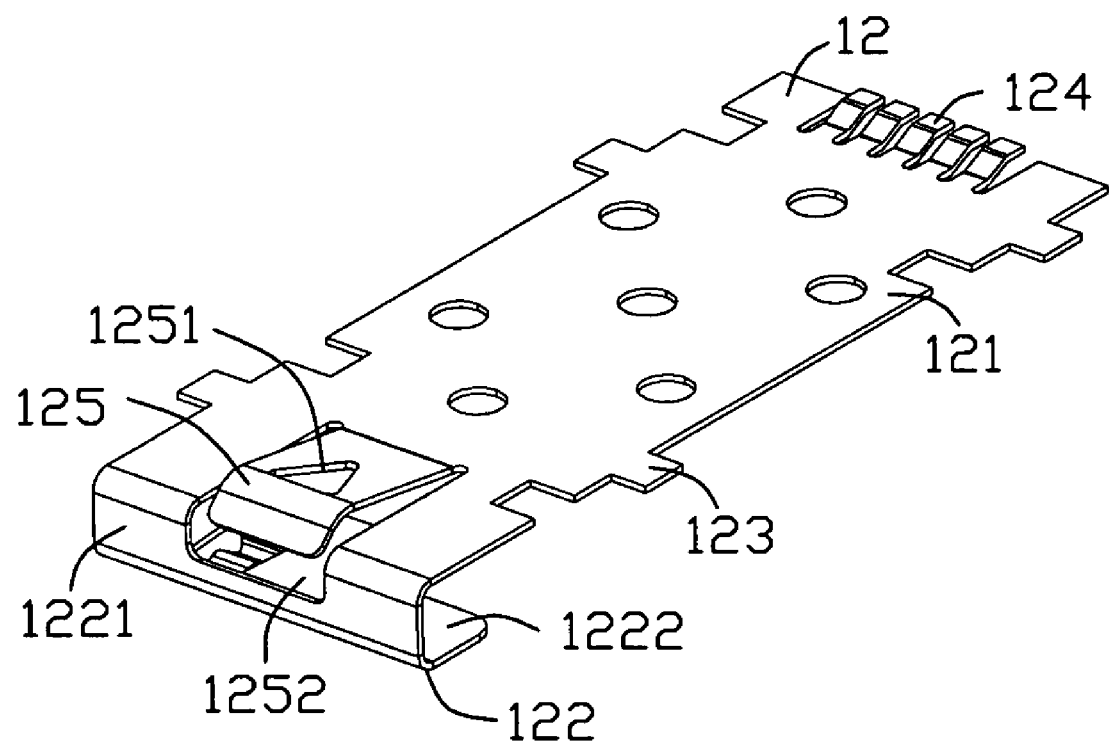
FIG. 4 is perspective view showing an intermediate wall of the stacked pluggable cage.
Figure 5:
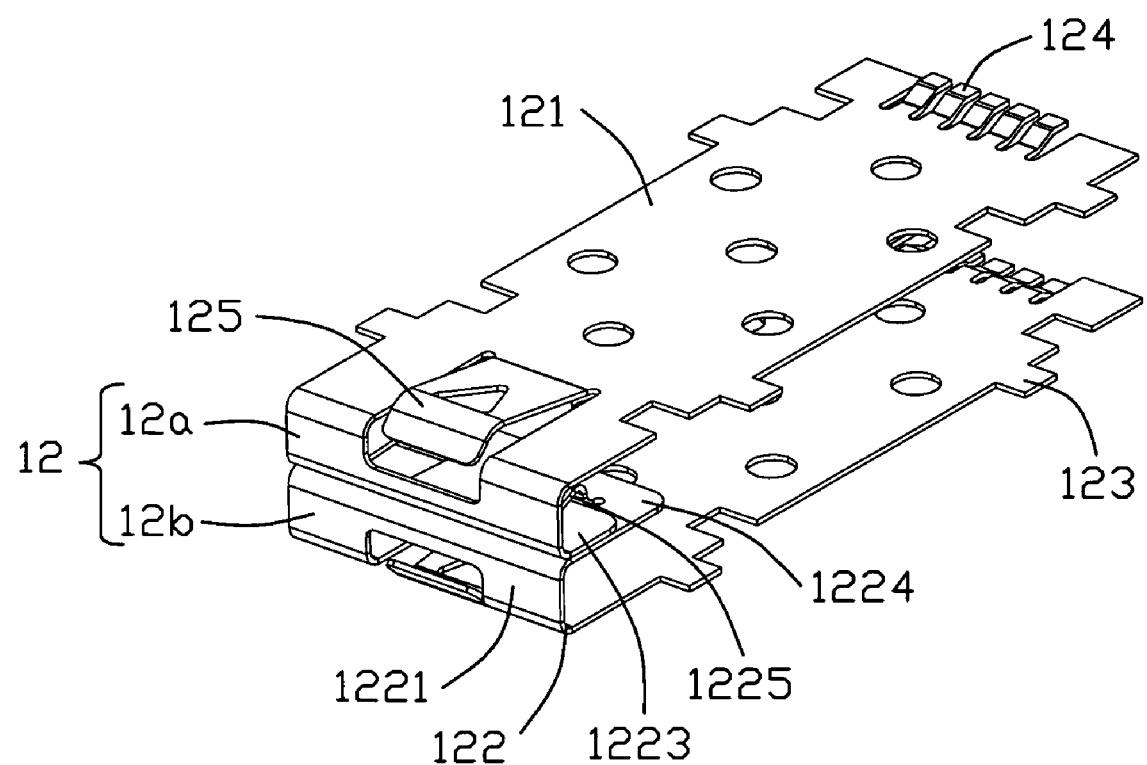
FIG. 5 is a perspective view showing the cooperation of the two intermediate walls mounted in the shielding shroud, with the shielding shroud being removed.

Referring to FIGS. 4-5, the pair of intermediate walls 12 comprise an upper intermediate wall 12a and a lower shielding plate 12b having generally same configurations. Each intermediate wall 12 is formed with a rectangular body portion 121. The body portion 121 has a front portion bending vertically then backwardly to form an L-shaped bending portion 122. The bending portion 122 comprises a vertically extending neck portion 1221 and a horizontally extending beam portion 1222. In conjunction with FIGS. 6-7, the beam portion 1222 has a small portion 1223 and a large portion 1224 connected side-by-side. The small portion 1223 has a dimension along a mating direction smaller than that of the large portion 124, which is provided with a resilient extending locking tail 1225 of a continuously arch-like configuration. The body portion 121 has a slot 1252 defined adjacent to the bending portion 122 to make a tongue portion 125 extending out of the slot 1252 and resiliently tilting from the body portion 121. The tongue portion 125 has a locking hole 1251 defined thereon for engaging with the locking protrusion 201 of the transceiver 200. The body portion 121 has a plurality of flexible and cantilevered fingers 124 arranged in comb configuration formed at a rear portion thereof and tilting toward the transceiver 200, and a plurality of engaging tabs 123 extending laterally for engaging with the engaging slits 116 of the side walls 113 of the shielding shroud 11.

Referring to FIGS. 1-3, in assembly of the pluggable cage 100, the two intermediate walls 12 are inserted in a middle portion of the receiving space to thereby divide the receiving space 13 into two separated stacked upper and lower receiving subspaces 13a, 13b for respectively receiving two transceivers 200. The upper and lower intermediate walls 12a and 12b secured in the middle portion of the receiving space 13 via an engagement between the engaging tabs 123 and the engaging slits 116 of the side walls 113 of the shielding shroud 11.

Figure 8:
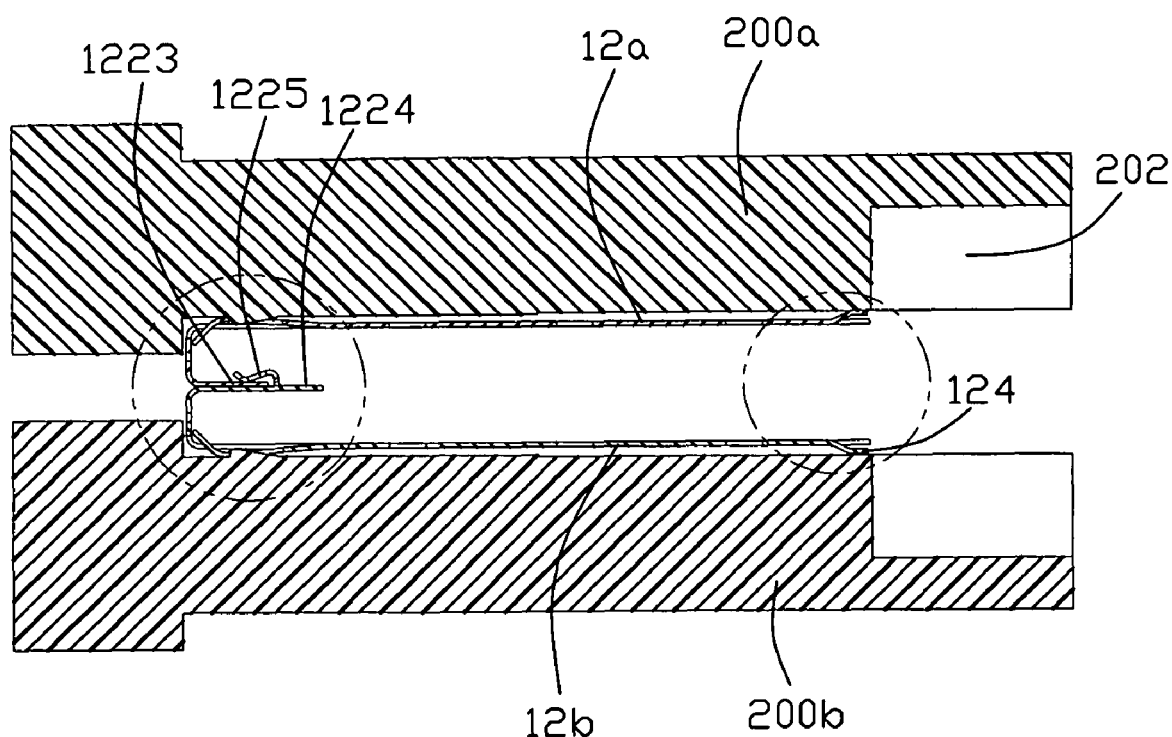
FIG. 8 is a cross-sectional view of the stacked pluggable cage as shown in FIG. 2, with the shielding shroud being removed.
Figure 9:
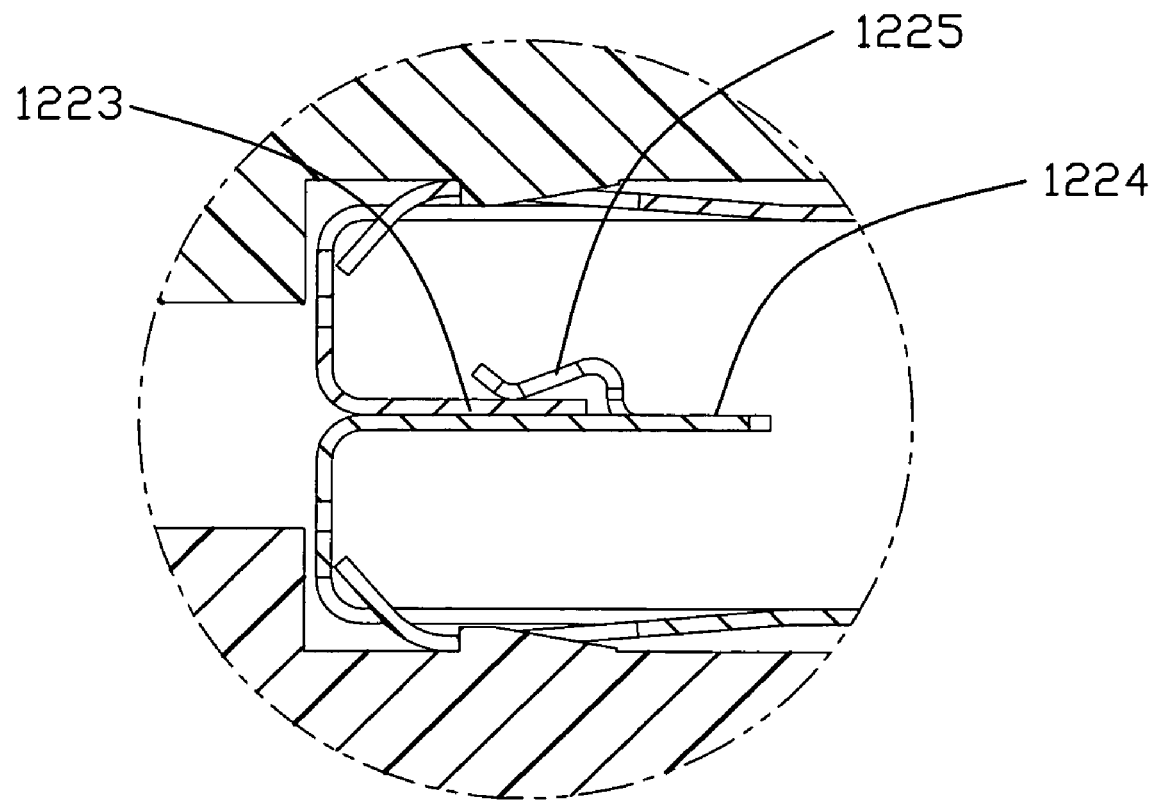
FIG. 9 is an enlarged view showing the front part of the intermediate walls as marked in FIG. 8.
Figure 10:
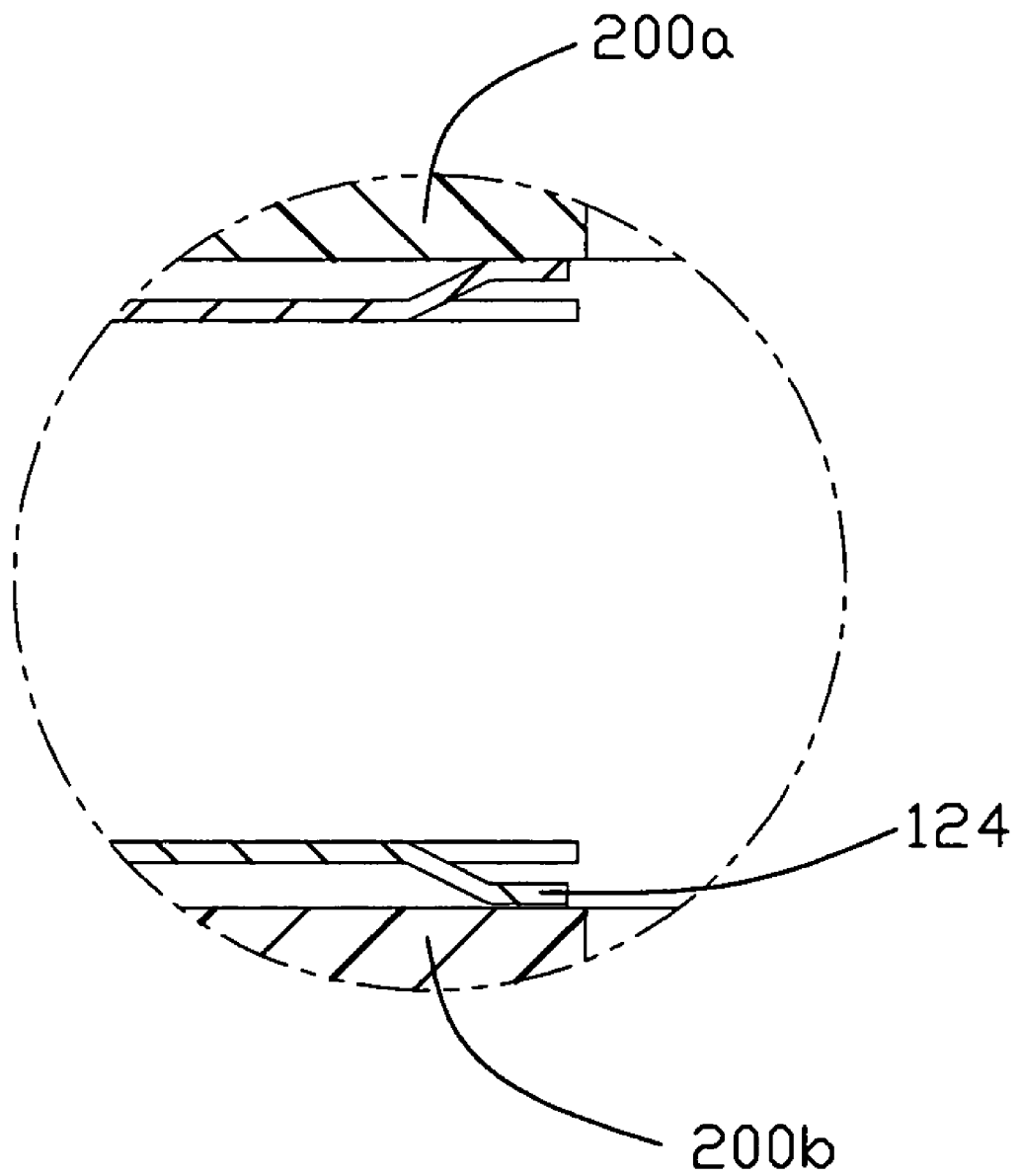
FIG. 10 is an enlarged view showing the rear port of the intermediate walls as marked in FIG. 8.

Referring to FIGS. 1 and 5, the upper and lower intermediate walls 12a and 12b are stacked in a face-to-face fashion, with the upper receiving subspace 13a disposed above the upper intermediate wall 12a and the lower receiving subspace 13b disposed below the lower intermediate wall 12b. The bending portion 122 of the upper intermediate wall 12a is disposed adjacent to the bending portion 122 of the lower intermediate wall 12b. In conjunction with FIGS. 8 and 9, the beam portions 1222 of the upper and lower intermediate walls 12a and 12b are in contact with each other, with the locking tail 1225 of one intermediate wall 12 locking with the small portion 1223 of another intermediate wall 12, to secure the upper and lower intermediate walls 12a and 12b within the shielding shroud 11. The neck portions 1221 of the upper and lower intermediate walls 12a and 12b are connected with each other to serve as a front wall of the shielding shroud 11 between the upper and lower receiving subspaces 13a and 13b. In conjunction with FIG. 10, the flexible fingers 124 of the upper intermediate wall 12a project obliquely.

Figure 6:
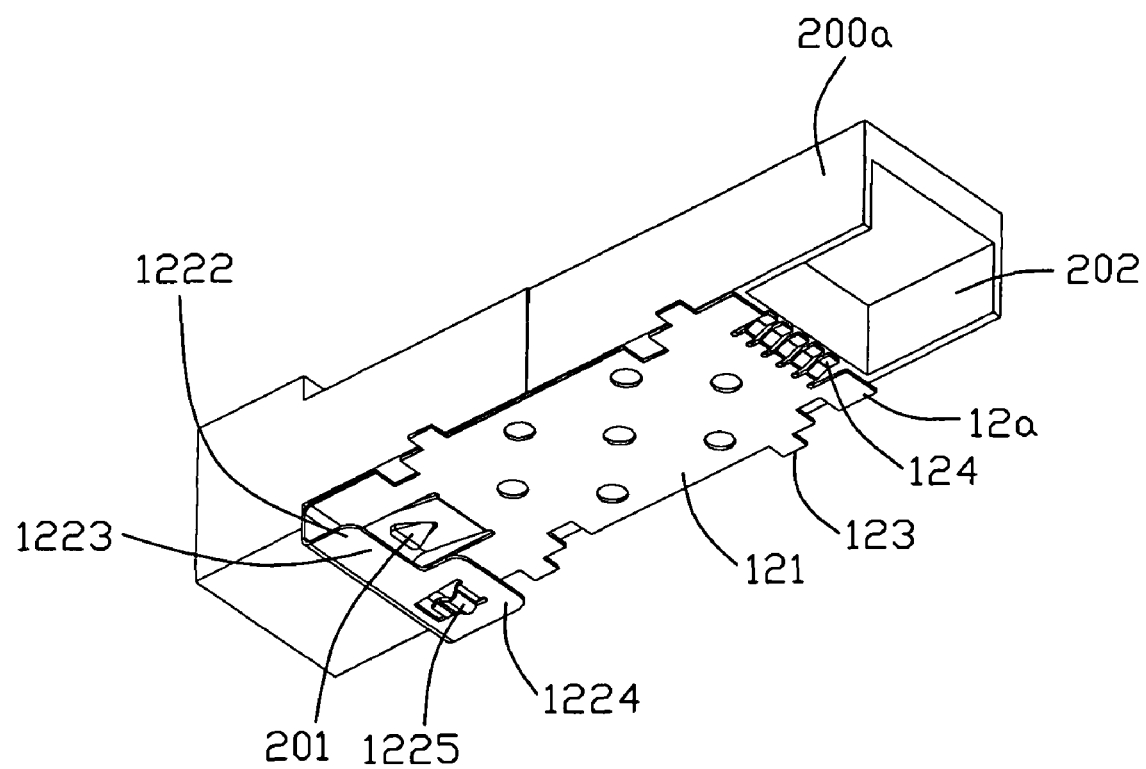
FIG. 6 is a perspective view showing the engagement between the upper shielding plate and the upper transceiver.
Figure 7:
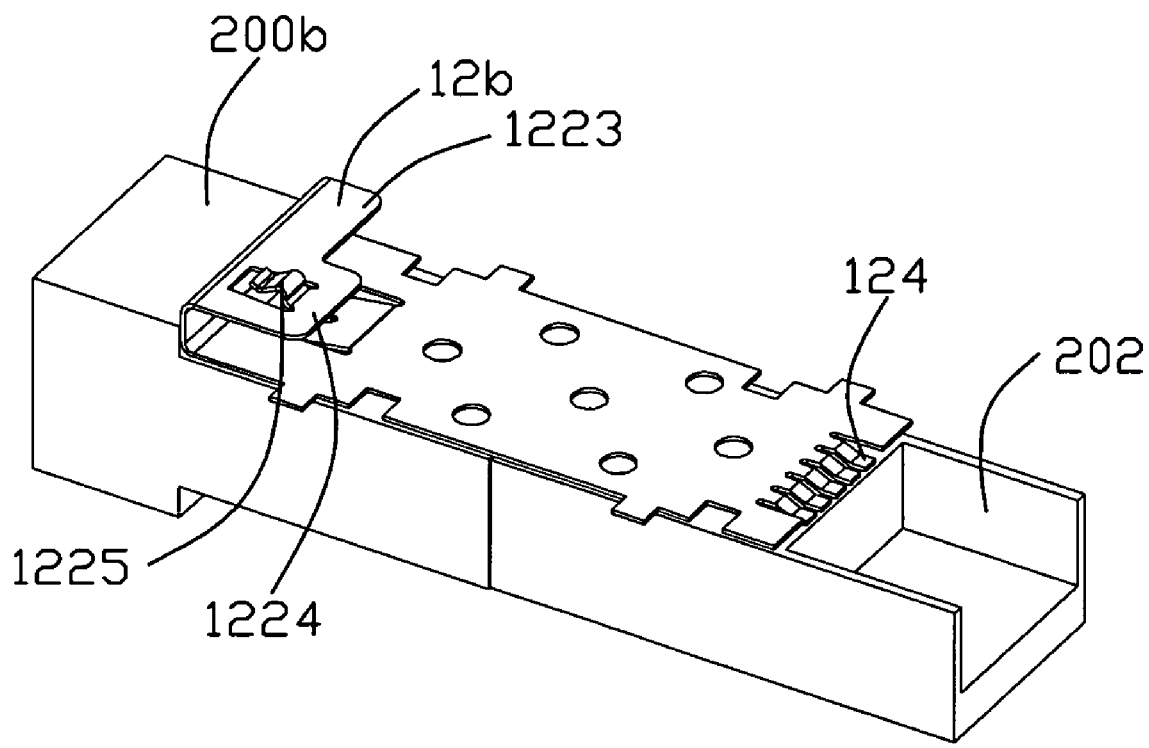
FIG. 7 is a perspective view showing the engagement between the lower shielding plate and the lower transceiver.

Referring to FIGS. 1-2, in conjunction with FIGS. 6-7, when the upper and lower transceivers 200a and 200b are inserted into the upper and lower receiving subspaces 13a and 13b along the mating direction, the locking protrusions 201 of the transceivers 200 are locked within the locking holes 1251 of the tongue portions 125 of the intermediate walls 12. Simultaneously, in conjunction with FIGS. 8 and 10, the flexible fingers 124 of the upper intermediate wall 12a come into contact with a bottom surface of the upper transceiver 200a and the flexible fingers 124 of the lower intermediate wall 12b come into contact with a top of the lower transceiver 200b for grounding the upper and lower transceivers 200a and 200b to thereby improve EMI shielding.

When the stacked pluggable cage 100 is mounted onto a circuit board (not shown), a module (not shown) is inserted into the cavities 202 of the transceivers 200 through the bottom opening 15 of the shielding shroud 11.

When the stacked pluggable cage 100 is formed with two or more than two stacked ports for receiving corresponding number of transceivers 200, the intermediate walls 12 inserted in each receiving subspaces would have the flexible fingers 124 in contact with each transceiver 200 thereby providing a reliable and robust grounding to each transceiver 200. Therefore, the EMI performance to the transceivers 200 has been improved.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A stacked pluggable cage adapted for receiving at least two transceivers, comprising:
    a shielding shroud having a plurality of walls interconnected together to define a receiving space therebetween;
    a first and a second intermediate walls disposed in the shielding shroud and adjacent to each other to divide the receiving space into a first receiving subspace above the first intermediate wall and a second receiving subspace below the second intermediate wall for receiving the transceivers respectively, each intermediate wall having a body portion, a bending portion bent from a front portion of the body portion, and a plurality of flexible fingers extending rearwardly from a rear portion of the body portion and tilting toward corresponding receiving subspace to ground corresponding transceiver,
    said first intermediate wall and said second intermediate wall separated from each other and stacked one above the other, wherein said bending portion of each intermediate wall comprises a beam portion connected to the neck portion and extending parallel to the body portion, said first and second intermediate walls mounted in the shielding shroud in a face-to-face fashion, with the beam portions of the first and second shielding plates in contact with each other.

2. The stacked pluggable cage as claimed in claim 1, wherein said plurality of flexible fingers of the intermediate wall are formed as a cantilevered comb-like configuration.

3. The stacked pluggable cage as claimed in claim 1, wherein said bending portion of each intermediate wall comprises a vertically extending neck portion, said neck portions of the first and second intermediate walls connected with each other to form as a front wall of the shielding shroud between the first and second receiving subspaces.

4. The stacked pluggable cage as claimed in claim 1, wherein said beam portion of each intermediate wall comprises a small portion and a large portion connected side-by-side, said large portion formed with a locking tail, said locking tail of one intermediate wall locking with the small portion of the other intermediate wall.

5. The stacked pluggable cage as claimed in claim 1, wherein said body portion of the intermediate wall has a resiliently extending tongue portion defining a locking hole locking with a locking protrusion formed on the transceiver.

6. The stacked pluggable cage as claimed in claim 1, wherein said walls of the shielding shroud comprise a top wall, a bottom wall, a rear wall and a pair of side walls defining a plurality of engaging slits, and wherein said body portion of the intermediate wall has a plurality of engaging tabs engaging with the engaging slits of the shielding shroud for fixing the intermediate wall to the shielding shroud.

7. The stacked pluggable cage as claimed in claim 6, wherein said bottom wall of the shielding shroud defines a bottom opening for insertion of a module connector and has a plurality of foot portions extending downwardly for connecting to a circuit board.

8. A receptacle for receiving two modules therein and electrically connecting said modules to a host circuit board mounted within a chassis of a host system, said receptacle comprising:
- a housing having a front, a back wall, a top wall, a bottom wall, and side walls and defining a cavity for receiving a module, said bottom wall having a bottom opening to receive a receptacle connector, said front having a front opening to receive said module, the walls comprising a conductive material;
- a plurality of elongated members extending down from said housing past said bottom wall and adapted for electrical connection to a host circuit board such that said walls are electrically connected to said host circuit board;
- first and second intermediate partitioning plates disposed between the side walls dividing the cavity into a first receiving space and a second receiving space for receiving said two modules, respectively; and
- interlocking arrangement between the partitioning plates including a clip on the first partitioning plate, and a tab on the second partitioning plate securely retained within the clip.

9. The receptacle as claimed in claim 8, wherein each of said first and second intermediate partitioning plates defines a locking hole to latch the corresponding module.

10. The receptacle as claimed in claim 9, wherein the locking holes of said first and second intermediate partitioning plates are located between said first and second receiving space.

11. The receptacle as claimed in claim 8, wherein the partitioning plate defines a front face for confrontation with an expanded portion of the corresponding module in a front-to-back direction.

12. A receptacle for receiving two modules and electrically connecting said modules to a host circuit board mounted within a chassis of a host system, said receptacle comprising:
- a housing having a front, a back wall, a top wall, a bottom wall, and side walls and defining a cavity for receiving a module, said bottom wall having a bottom opening to receive a receptacle connector, said front having a front opening to receive said module, the walls comprising a conductive material;
- a plurality of elongated members extending down from said housing past said bottom wall and adapted for electrical connection to a host circuit board such that said walls are electrically connected to said host circuit board; and
- first and second intermediate partitioning plates disposed between the side walls and dividing the cavity into a first receiving space and a second receiving space for receiving said two modules, respectively, each partitioning plate unitarily including a rear end with a plurality of resilient fingers extending into the first and second receiving space respectively,
- said plurality of resilient fingers of the first intermediate partitioning plate having free ends adjacent to the rear end of the first intermediate partitioning plate along a front-to-back direction, wherein said free ends of the plurality of resilient fingers of the first intermediate partitioning plate is flush with or a certain distance receded inwardly from the rear end of the first intermediate partitioning plate along the front-to-back direction.

13. The receptacle as claimed in claim 12, wherein each of said first and second intermediate partitioning plates defines a locking hole to latch the corresponding module.

14. The receptacle as claimed in claim 13, wherein the locking holes of said first and second intermediate partitioning plates are located between said first and second receiving space.

15. The receptacle as claimed in claim 12, wherein the partitioning plate defines a front face for confrontation with an expanded portion of the corresponding module in a front-to-back direction.

16. The receptacle as claimed in claim 12, wherein said resilient fingers are protectively located between two planar portions of the partitioning plate in a transverse direction perpendicular to said front-to-back direction.

* * * * *